(12) United States Patent
Chen et al.

(10) Patent No.: US 11,152,515 B2
(45) Date of Patent: Oct. 19, 2021

(54) SEMICONDUCTOR DEVICE AND MANUFACTURING METHOD THEREOF

(71) Applicant: UNITED MICROELECTRONICS CORP., Hsin-Chu (TW)

(72) Inventors: Chin-Hung Chen, Tainan (TW); Ssu-I Fu, Kaohsiung (TW); Chih-Kai Hsu, Tainan (TW); Chun-Ya Chiu, Tainan (TW); Chia-Jung Hsu, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 2 days.

(21) Appl. No.: 16/572,556

(22) Filed: Sep. 16, 2019

(65) Prior Publication Data

US 2021/0050456 A1    Feb. 18, 2021

(30) Foreign Application Priority Data

Aug. 16, 2019   (TW) .................................. 108129242

(51) Int. Cl.
*H01L 29/786* (2006.01)
*H01L 29/06* (2006.01)
(Continued)

(52) U.S. Cl.
CPC .. *H01L 29/78696* (2013.01); *H01L 21/02603* (2013.01); *H01L 21/30612* (2013.01); *H01L 21/30625* (2013.01); *H01L 29/0673* (2013.01); *H01L 29/42392* (2013.01); *H01L 29/66522* (2013.01); *H01L 29/66742* (2013.01); *H01L 29/78681* (2013.01)

(58) Field of Classification Search
CPC .......... H01L 29/78696; H01L 29/0673; H01L 29/42392; H01L 29/66522; H01L 29/66742; H01L 29/78681; H01L 21/02603; H01L 21/30612; H01L 21/30625

See application file for complete search history.

(56) References Cited

U.S. PATENT DOCUMENTS 9,123,567 B2   9/2015 Radosavljevic
9,748,404 B1   8/2017 Chang
(Continued)

*Primary Examiner* — Shaun M Campbell
(74) *Attorney, Agent, or Firm* — Winston Hsu

(57) ABSTRACT

A manufacturing method of a semiconductor device includes the following steps. An opening is formed penetrating a dielectric layer on a semiconductor substrate. A stacked structure is formed on the dielectric layer. The stacked structure includes a first semiconductor layer partly formed in the opening and partly formed on the dielectric layer, a sacrificial layer formed on the first semiconductor layer, and a second semiconductor layer formed on the sacrificial layer. A patterning process is performed for forming a fin-shaped structure including the first semiconductor layer, the sacrificial layer, and the second semiconductor layer. An etching process is performed to remove the sacrificial layer in the fin-shaped structure. The first semiconductor layer in the fin-shaped structure is etched to become a first semiconductor wire by the etching process. The second semiconductor layer in the fin-shaped structure is etched to become a second semiconductor wire by the etching process.

9 Claims, 15 Drawing Sheets

(51) Int. Cl.
    *H01L 29/423*     (2006.01)
    *H01L 29/66*     (2006.01)
    *H01L 21/306*     (2006.01)
    *H01L 21/02*     (2006.01)

(56) References Cited

U.S. PATENT DOCUMENTS

| | | | |
|---|---|---|---|
| 2018/0069006 A1* | 3/2018 | Kim | H01L 21/823842 |
| 2019/0198658 A1* | 6/2019 | Mohapatra | H01L 21/823431 |
| 2019/0341452 A1* | 11/2019 | Miao | H01L 29/78681 |
| 2021/0020638 A1* | 1/2021 | Shin | H01L 29/16 |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including semiconductor wires and a manufacturing method thereof.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device is progressed for achieving the ongoing goals of high performance, increased miniaturization of integrated circuit components, and greater packaging density of integrated circuits. However, under the concept of the GAA, the manufacturing yield and/or the electrical performance of the semiconductor device still has to be further improved by modifying related processes and/or structural design.

SUMMARY OF THE INVENTION

It is one of the objectives of the present invention to provide a semiconductor device and a manufacturing method thereof. An opening is formed in a dielectric layer for exposing a part of a semiconductor substrate, and a semiconductor layer may be formed on the dielectric layer by growing from the semiconductor substrate exposed by the opening. The semiconductor layer with higher quality may be formed on the dielectric layer by this approach, and manufacturing yield and/or electrical performance of the semiconductor device may be improved accordingly.

A manufacturing method of a semiconductor device is provided in an embodiment of the present invention. The manufacturing method includes the following steps. A dielectric layer is formed on a semiconductor substrate. An opening is formed penetrating the dielectric layer and exposing a part of the semiconductor substrate. A stacked structure is formed on the dielectric layer. The stacked structure includes a first semiconductor layer, a sacrificial layer, and a second semiconductor layer. The first semiconductor layer is partly formed in the opening and partly formed on the dielectric layer. The sacrificial layer is formed on the first semiconductor layer. The second semiconductor layer is formed on the sacrificial layer. A patterning process is performed for forming at least one fin-shaped structure on the semiconductor substrate. The stacked structure is patterned by the patterning process, and the at least one fin-shaped structure includes a part of the first semiconductor layer, a part of the sacrificial layer, and a part of the second semiconductor layer. An etching process is performed to remove the sacrificial layer in the at least one fin-shaped structure. The first semiconductor layer in the at least one fin-shaped structure is etched to become a first semiconductor wire by the etching process, and the second semiconductor layer in the at least one fin-shaped structure is etched to become a second semiconductor wire by the etching process.

A semiconductor device is provided in an embodiment of the present invention. The semiconductor device includes a semiconductor substrate, a fin-shaped structure, a first semiconductor wire, and a second semiconductor wire. The fin-shaped structure is disposed on the semiconductor substrate. The fin-shaped structure includes a semiconductor fin, a dielectric layer, and a barrier layer. The dielectric layer is disposed on the semiconductor fin. The barrier layer is disposed between the dielectric layer and the semiconductor fin in a thickness direction of the semiconductor substrate. The first semiconductor wire is disposed above the fin-shaped structure. The second semiconductor wire is disposed above the first semiconductor wire. The first semiconductor wire is disposed between the second semiconductor wire and the fin-shaped structure in the thickness direction of the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-13 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, and FIG. 13 is a cross-sectional diagram taken along another direction in FIG. 12.

FIG. 14 and FIG. 15 are schematic drawings illustrating a manufacturing method of a semiconductor device according to a second embodiment of the present invention, wherein FIG. 15 is a schematic drawing in a step subsequent to FIG. 14.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
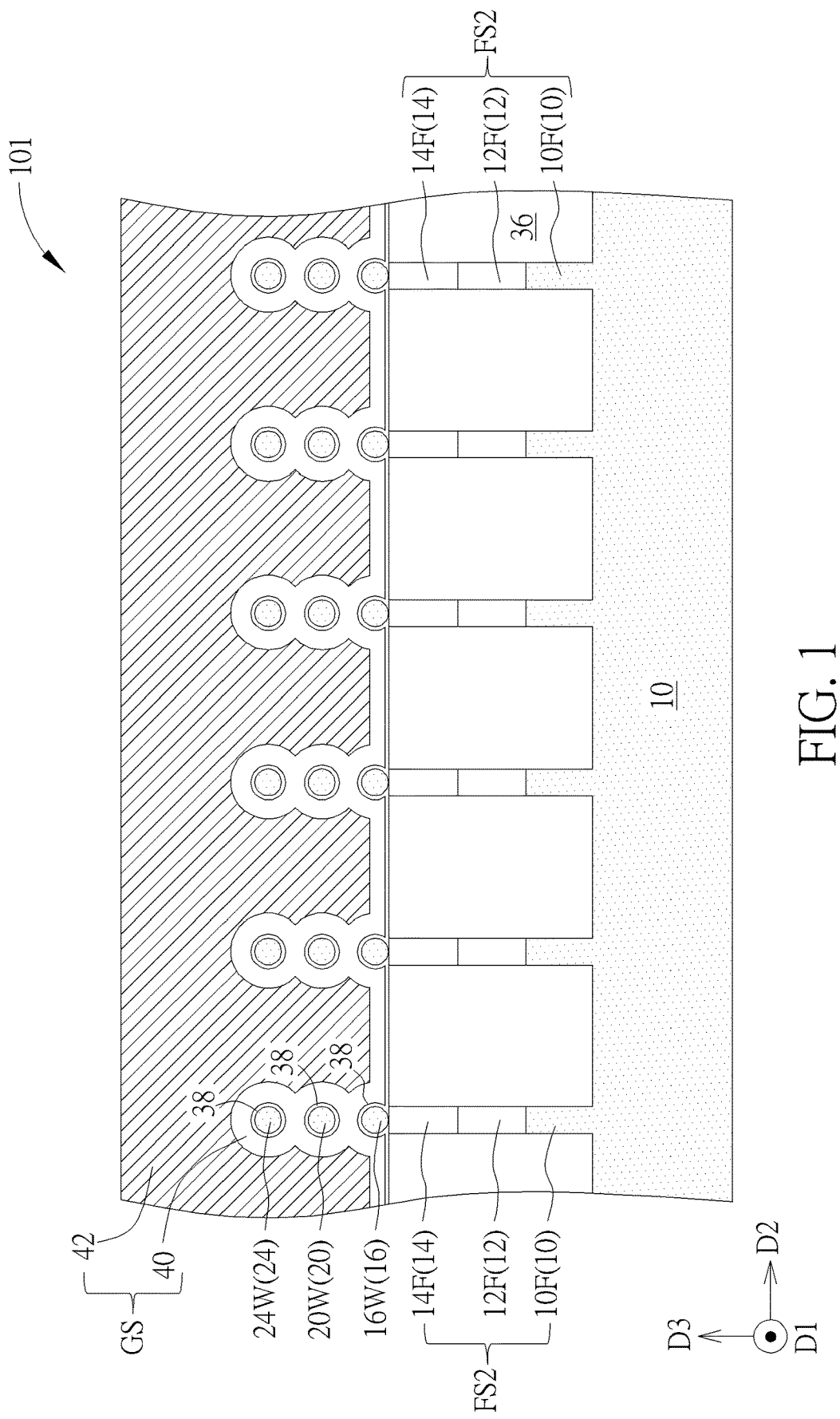
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 is provided in this embodiment. The semiconductor device 101 includes a semiconductor substrate 10, a fin-shaped structure (such a second fin-shaped structure FS2 shown in FIG. 1), a first semiconductor wire 16W, and a second semiconductor wire 20W. The second fin-shaped structure 20W is disposed on the semiconductor substrate 10. The second fin-shaped structure 20W includes a semiconductor fin 10F, a barrier layer 12, and a dielectric layer 14. The dielectric layer 14 is disposed on the semiconductor fin 10F, and the barrier layer 12 is disposed between the dielectric layer 14 and the semiconductor fin 10F in a thickness direction of the semiconductor substrate 10 (such as a third direction D3 shown in FIG. 1). The first semiconductor wire 16W is disposed above the second fin-shaped structure FS2. The second semiconductor wire 20W is disposed above the first semiconductor wire 16W. The first semiconductor wire 16W is disposed between the second semiconductor wire 20W and the second fin-shaped structure FS2 in the thickness direction of the semiconductor substrate 10 (such as the third direction D3).

Specifically, in some embodiments, the semiconductor device 101 may include a plurality of the second fin-shaped structures FS2, a plurality of the first semiconductor wires 16W, and a plurality of the second semiconductor wires 20W. Each of the second fin 0 shaped structures FS2 may be elongated in a first direction D1, and the second fin-shaped structures FS2 may be disposed repeatedly in a second direction D2. Each of the first semiconductor wires 16W may be elongated in the first direction D1, and each of the first semiconductor wires 16 may be disposed above the corresponding second fin-shaped structure FS2 in the third direction D3. Each of the second semiconductor wires 20W may be elongated in the first direction D1, and each of the second semiconductor wires 20W may be disposed above the corresponding second fin-shaped structure FS2 and the corresponding first semiconductor wire 16W in the third direction D3. In other words, an elongation direction of each of the first semiconductor wires 16W, an elongation direction of each of the second semiconductor wires 20W, and a elongation direction of each of the second fin-shaped structures FS2 may be parallel to one another and orthogonal to the thickness direction of the semiconductor substrate 10 (such as the third direction D3), but not limited thereto.

Additionally, in some embodiments, the semiconductor device 101 may further include an isolation structure 36, a gate dielectric layer 38, and a gate structure GS. The isolation structure 36 may be disposed between the second fin-shaped structures FS2 adjacent to one another, and the isolation structure 36 may cover a sidewall of the second fin-shaped structure FS2. The gate dielectric layer 38 may be disposed on each of the first semiconductor wires 16W and each of the second semiconductor wires 20W. The gate structure GS may be elongated in the second direction D2 and disposed on the gate dielectric layer 38. In some embodiments, the gate structure GS and the gate dielectric layer 38 may surround the semiconductor wires separated from one another (such as the first semiconductor wires 16W and the second semiconductor wires 20W separated from one another) for forming a gate-all-around (GAA) transistor structure, but not limited thereto. Additionally, in some embodiments, the semiconductor device 101 may further include a plurality of third semiconductor wires 24W. Each of the third semiconductor wires 24W may be elongated in the first direction D1, and each of the third semiconductor wires 24W may be disposed above the corresponding second fin-shaped structure FS2 and the second semiconductor wire 20W in the third direction D3. In other words, a plurality of semiconductor wires separated from one another (such as the first semiconductor wire 16W, the second semiconductor wire 20W, and the third semiconductor wire 24W separated from one another) may be disposed above each of the second fin-shaped structures FS2 for increasing the total surface area of the semiconductor wires covered by the gate structure GS, and the electrical performance of the semiconductor device 101 may be enhanced accordingly.

In some embodiments, the semiconductor substrate 10 may include a substrate formed of a III-V compound semiconductor material, such as a gallium nitride (GaN) substrate, a gallium arsenide (GaAs) substrate, an indium phosphide (InP) substrate, or a substrate formed of other suitable III-V compound semiconductor materials, but not limited thereto. In some embodiments, the semiconductor substrate 10 may include a base substrate (such as a silicon substrate) and a III-V compound semiconductor material layer formed thereon. In some embodiments, the semiconductor fin 10F in each of the second fin-shaped structures FS2 may be directly connected with the semiconductor substrate 10, and the material composition of the semiconductor fin 10F may be identical to the material composition of the semiconductor substrate 10, but not limited thereto. For instance, the semiconductor fins 10F may be formed by etching the semiconductor substrate 10 partially, and the semiconductor fins 10F may be regarded as a portion of the semiconductor substrate 10 and have the material composition identical to that of the semiconductor substrate 10 accordingly, but not limited thereto. Additionally, the barrier layer 12 in each of the second fin-shaped structures FS2 may include a III-V compound semiconductor layer or a barrier layer formed of other suitable barrier materials. It is worth noting that, in some embodiments, the barrier layer 12 may be used to protect the semiconductor substrate 10 during the process of forming the dielectric layer 14 for keeping the material of the semiconductor substrate 10 from being influenced by the process of forming the dielectric layer 14 and avoiding indirect influence on the quality of other semiconductor layer subsequently formed on the semiconductor substrate 10. The barrier layer 12 may be formed on the semiconductor substrate 10 by an epitaxial growth process preferably, and the barrier layer 12 may include a III-V compound material different from the semiconductor substrate 10 accordingly, but not limited thereto. For instance, the material of the barrier layer 12 may include aluminum gallium nitride (AlGaN), aluminum gallium arsenide (AlGaAs), indium gallium arsenide (InGaAs), or other suitable III-V compound materials. Therefore, the material composition of the barrier layer 12 may be different from the material composition of the dielectric layer 14 and the material composition of the semiconductor fin 10F, but not limited thereto.

In some embodiments, the material of the dielectric layer 14 may include oxide (such as aluminum oxide and/or silicon oxide), nitride, oxynitride, or other suitable dielectric materials. It is worth noting that, in some embodiments, the first semiconductor wire 16W may directly contact the dielectric layer 14, and a part of the dielectric layer 14 may be used as a gate dielectric layer accordingly, but not limited thereto. In this condition, the material of the dielectric layer 14 may be identical to the material of the gate dielectric layer 38, but not limited thereto. Additionally, the isolation structure 36 may include a single layer or multiple layers of insulation materials, such as silicon oxide, silicon nitride, silicon oxynitride, but not limited thereto. The first semiconductor wire 16W, the second semiconductor wire 20W, and the third semiconductor wire 24W may respectively include a III-V compound semiconductor material, such as gallium nitride, gallium arsenide, indium phosphide, or other suitable III-V compound semiconductor materials. It is worth noting that, in some embodiments, the first semiconductor wire 16W may be formed by patterning a semiconductor layer formed by an epitaxial growth approach, and the material composition of the first semiconductor wire 16W may be identical to the material composition of the semiconductor fin 10F and the material composition of the semiconductor substrate 10, but not limited thereto. Additionally, for process simplification, the first semiconductor wire 16W, the second semiconductor wire 20W, and the third semiconductor wire 24W may be made of the same semiconductor material for simplifying the corresponding etching steps, but not limited thereto. In some embodiments, different materials may be used to form the first semiconductor wire 16W, the second semiconductor wire 20W, and/or the third semiconductor wire 24W respectively according to some considerations. A cross-section shape of the first semiconductor wire 16W, the second semiconductor wire 20W, and/or the third semiconductor wire 24W may be a circle, an ellipse, a square, a rectangle, a triangle, or a rhombus.

In some embodiments, the gate dielectric layer 38 may include silicon oxide, silicon oxynitride, a high dielectric constant (high-k) material, or other suitable dielectric materials. The high-k material described above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. In addition, the gate structure GS may include a single layer or multiple layers of conductive materials. For example, the gate structure GS may include a work function layer 40 and a conductive layer 42 disposed on the work function layer 40. The gate dielectric layer 38 may be formed conformally on the first semiconductor wire 16W, the second semiconductor wire 20W, and the third semiconductor wire 24W, and the work function layer 40 may be substantially formed conformally on the gate dielectric layer 38 and the isolation structure 36. The work function layer 40 may include tantalum nitride (TaN), titanium nitride (TiN), titanium carbide (TiC), titanium aluminide (TiAl), titanium aluminum carbide (TiAlC), or other suitable n-type and/or p-type work function materials, and the conductive layer 42 may include a low resistivity metallic material, such as aluminum, tungsten, copper, titanium aluminide, or other suitable low resistivity metallic materials, but not limited thereto.

Figure 2:
Figure 3:
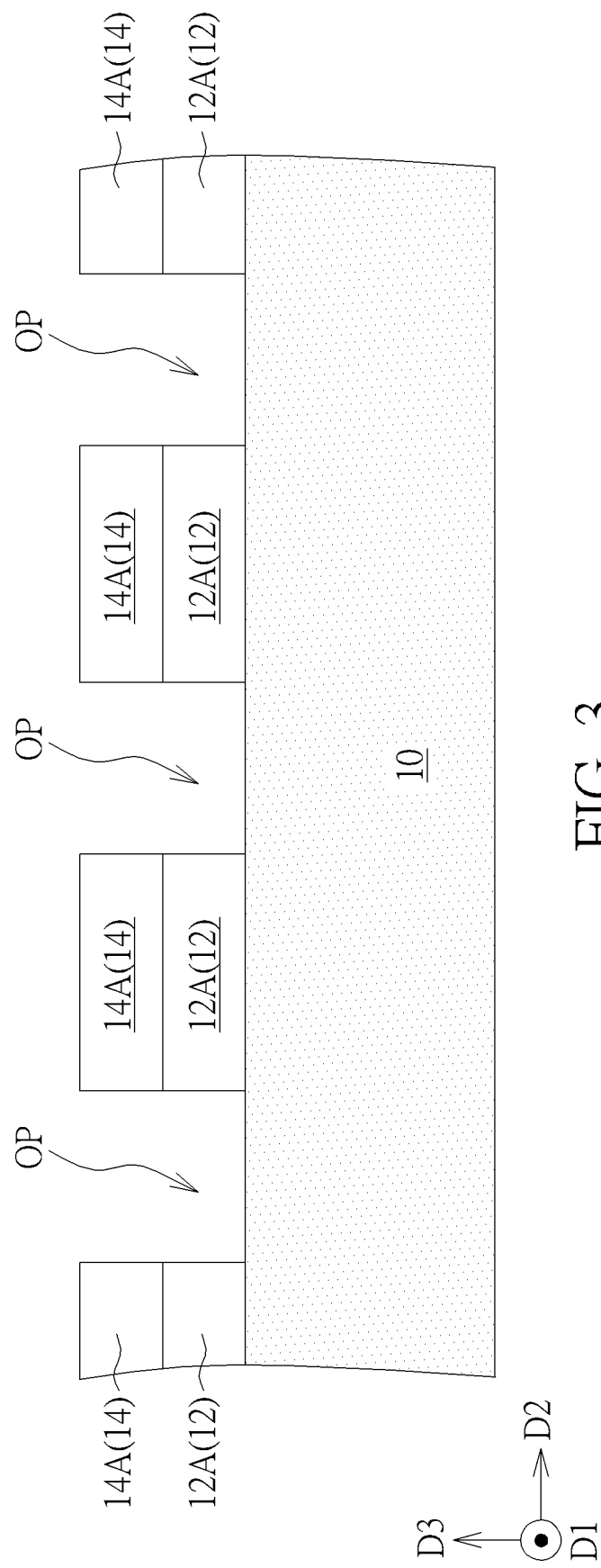
Figure 4:
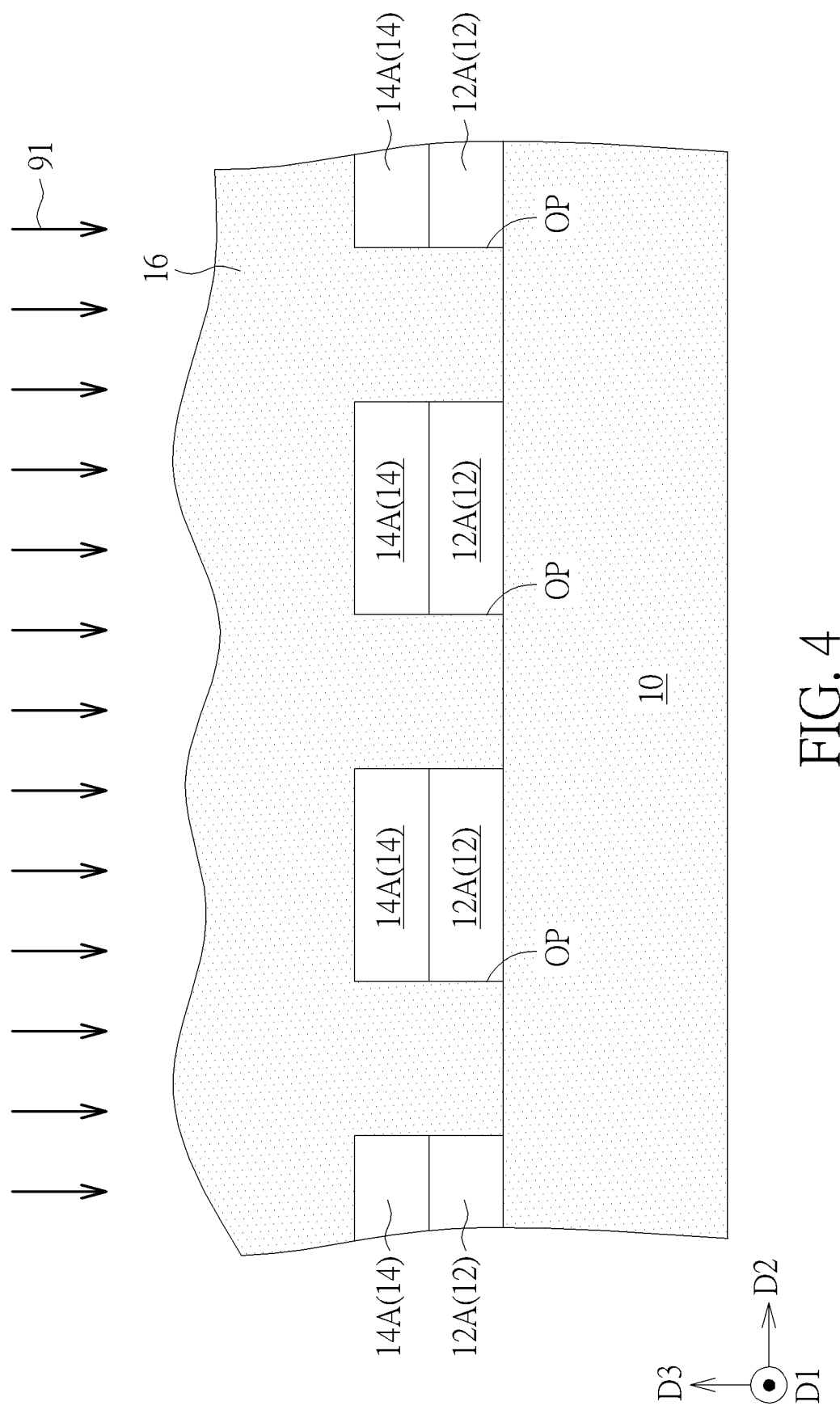
Figure 5:
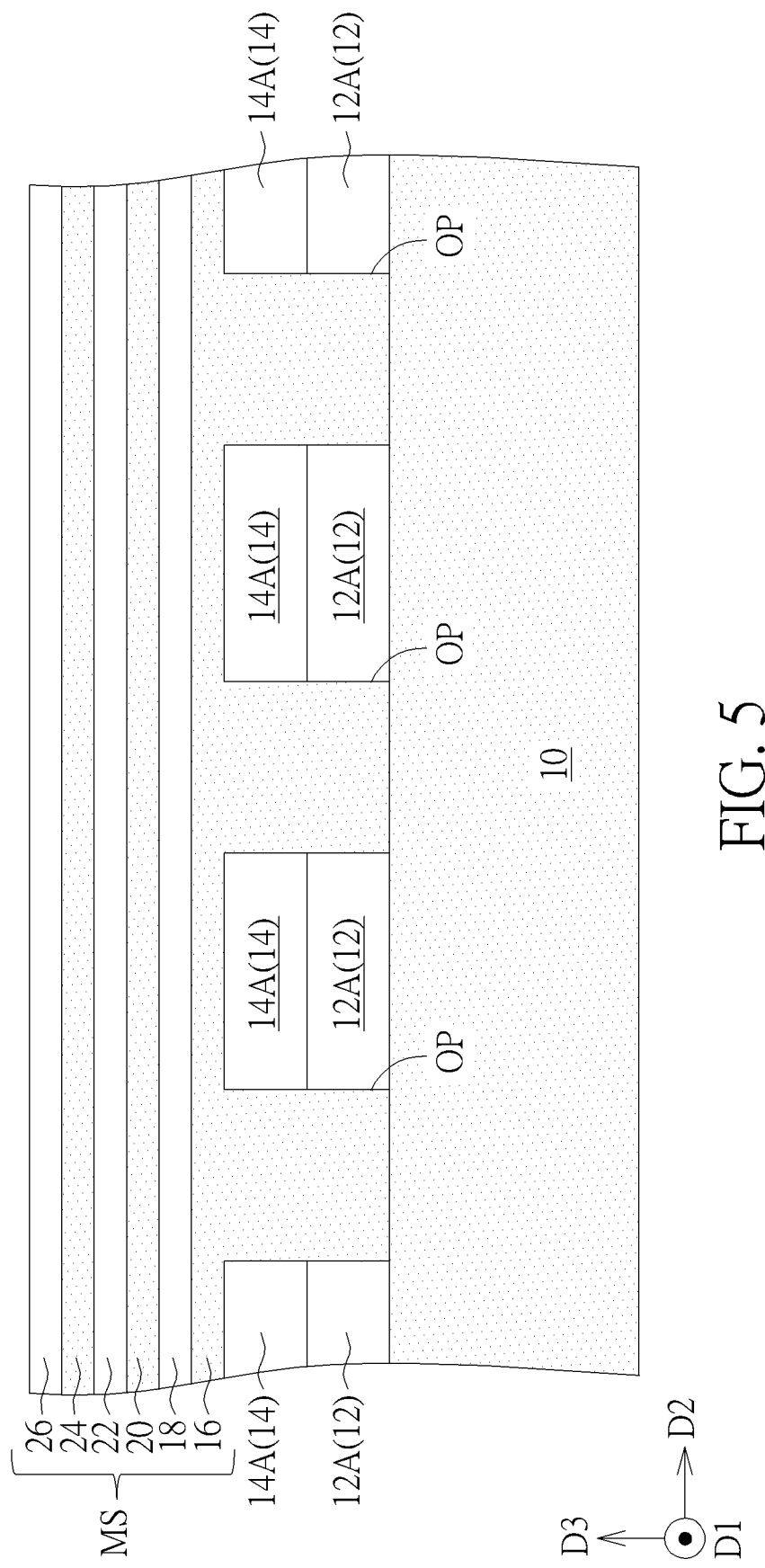
Figure 6:
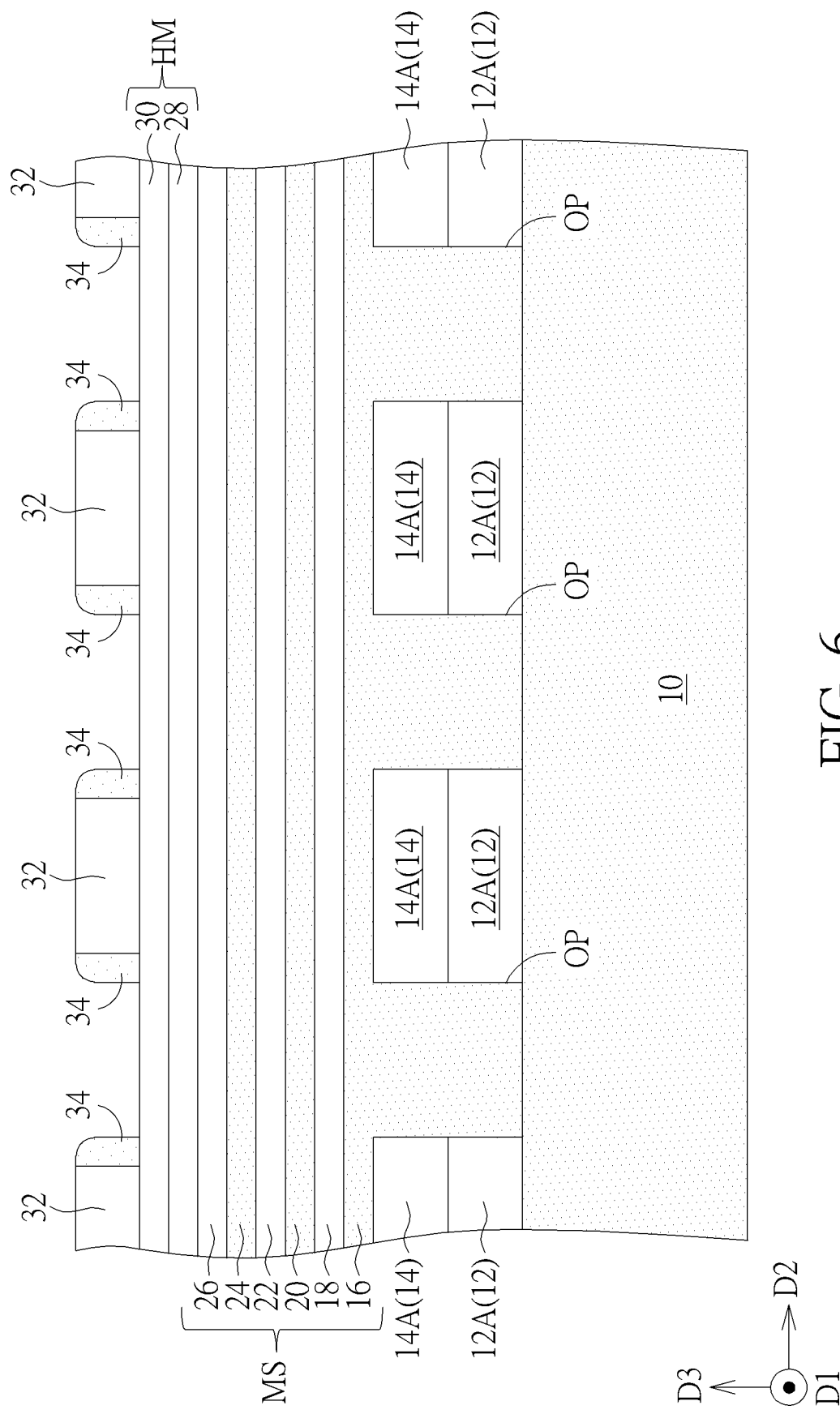
Figure 7:
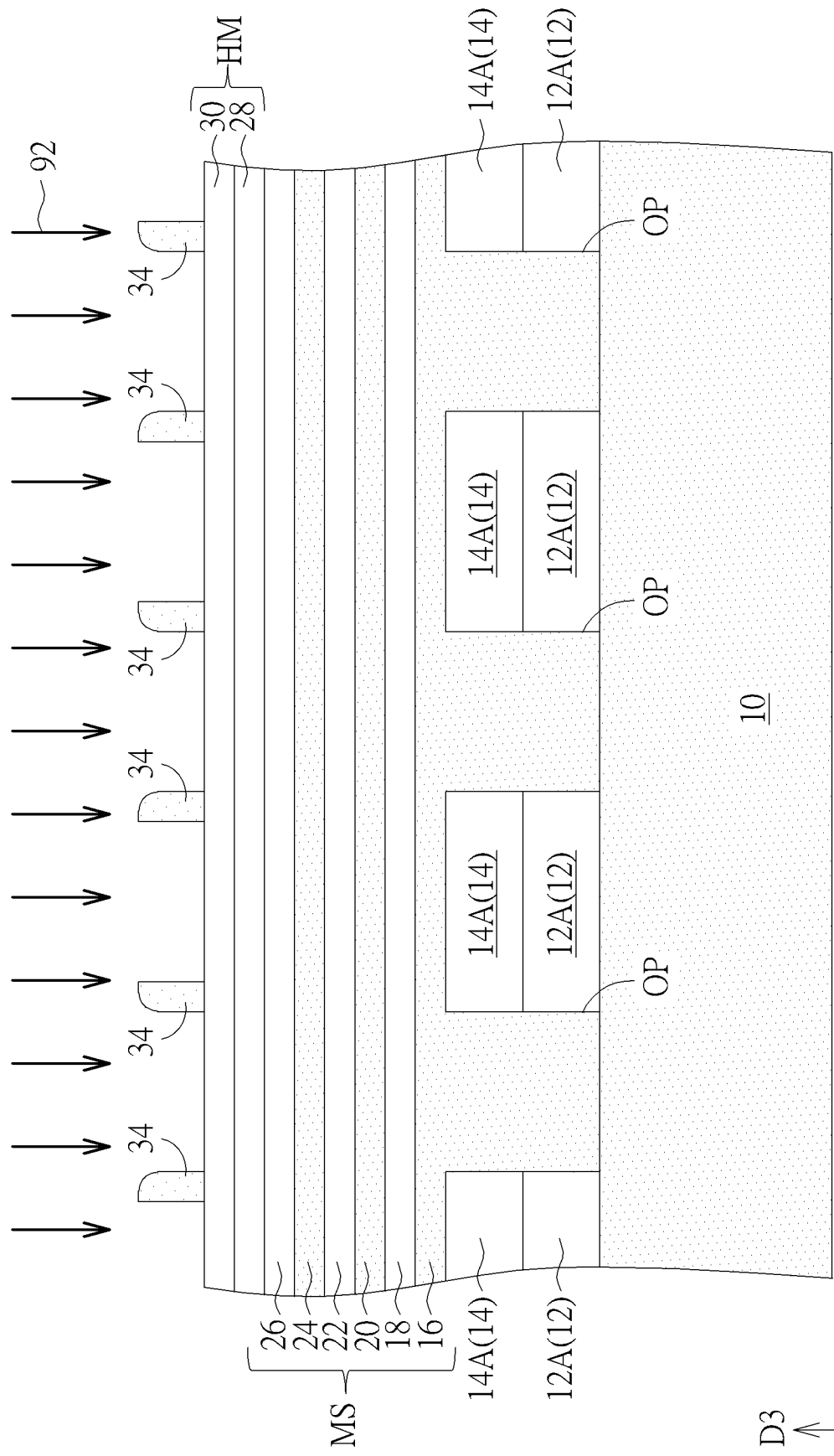
Figure 8:
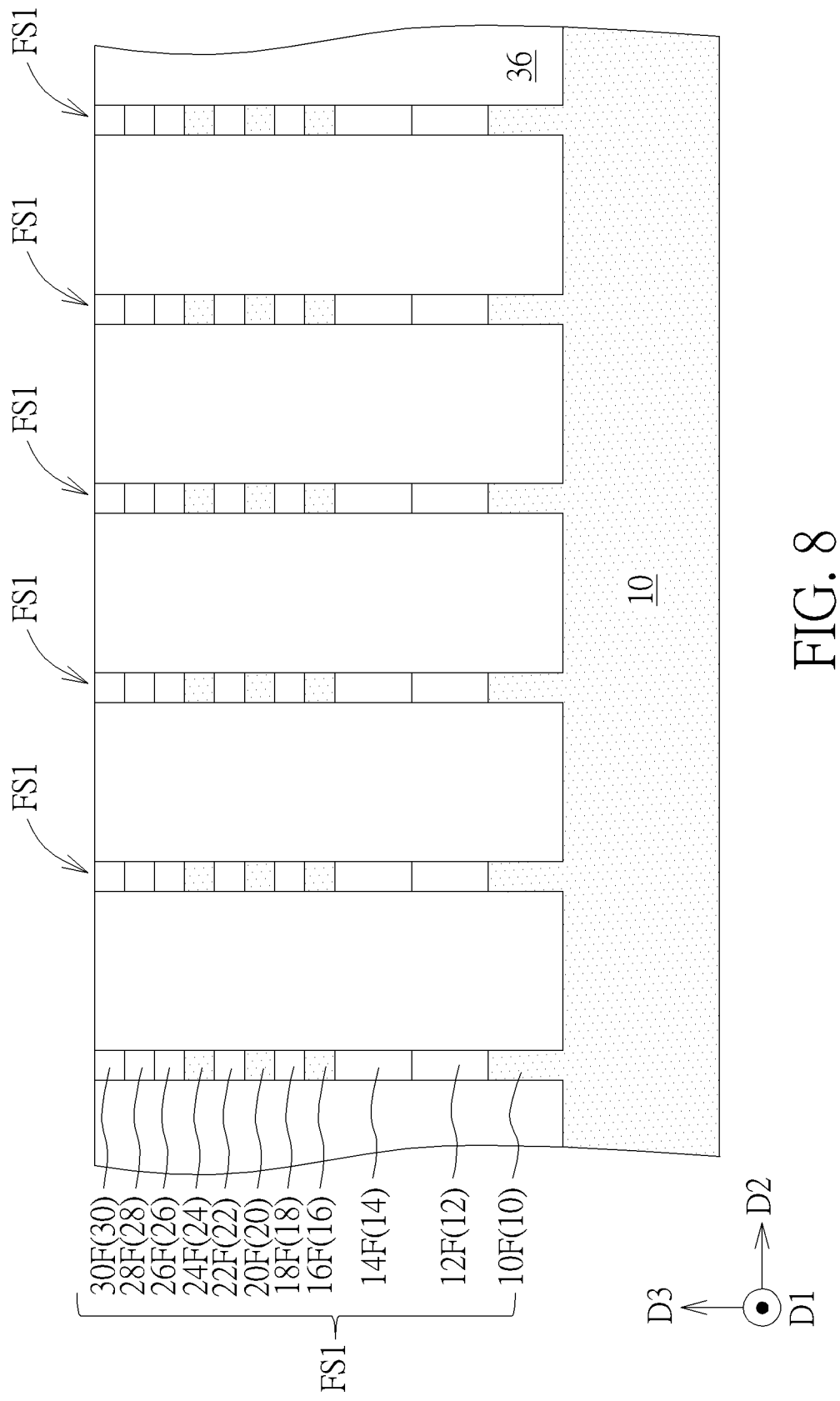
Figure 9:
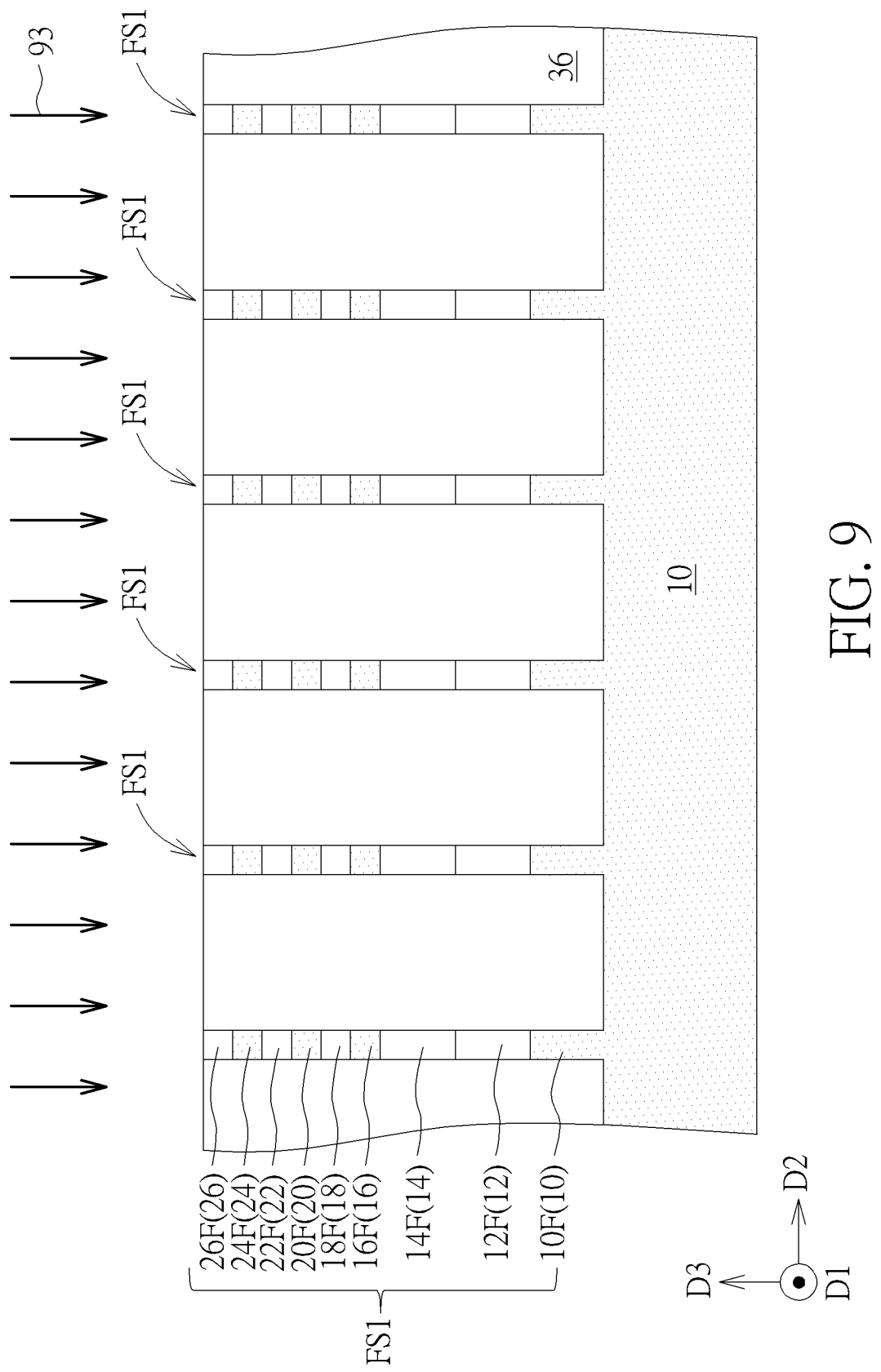
Figure 10:
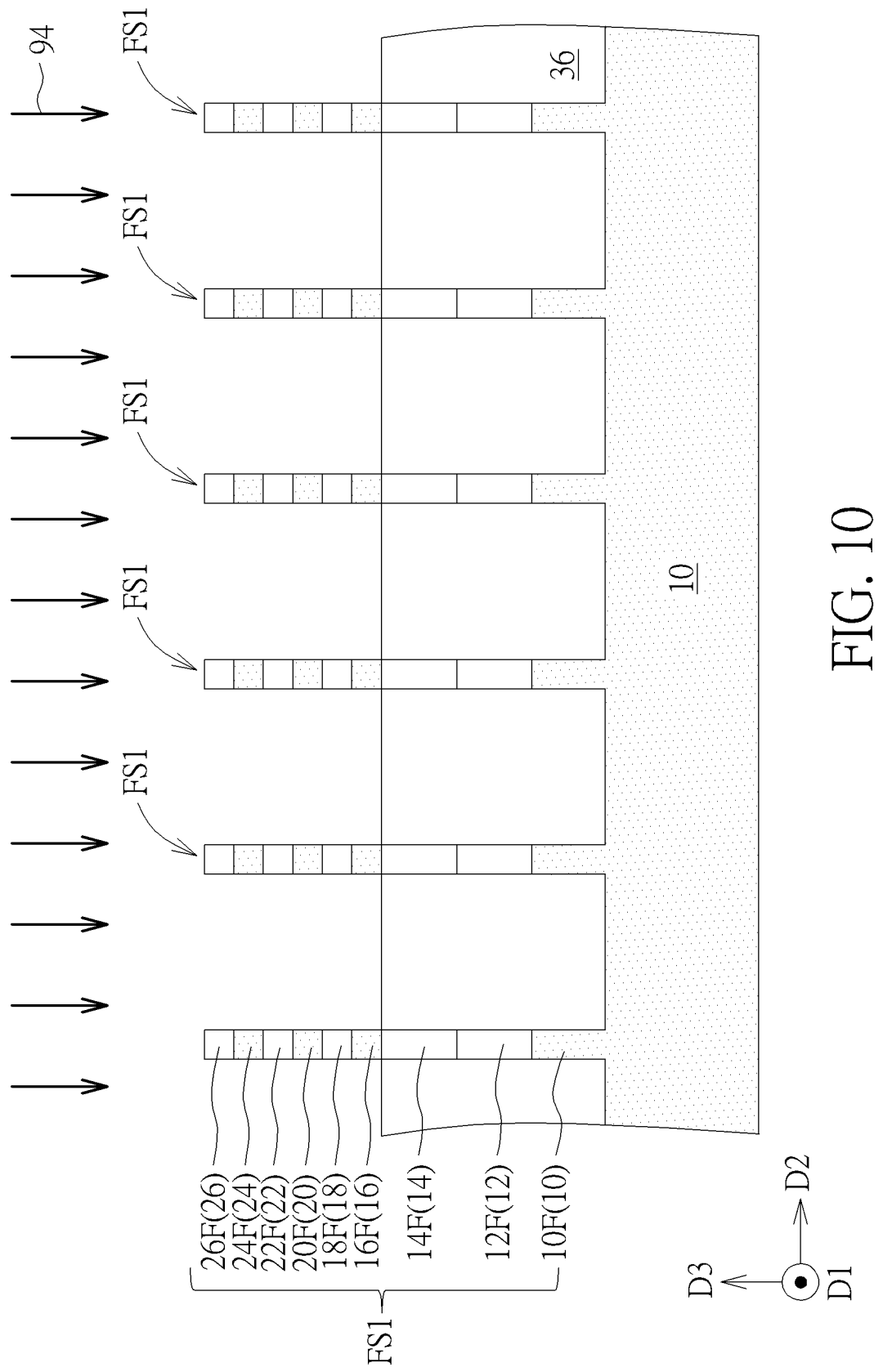
Figure 11:
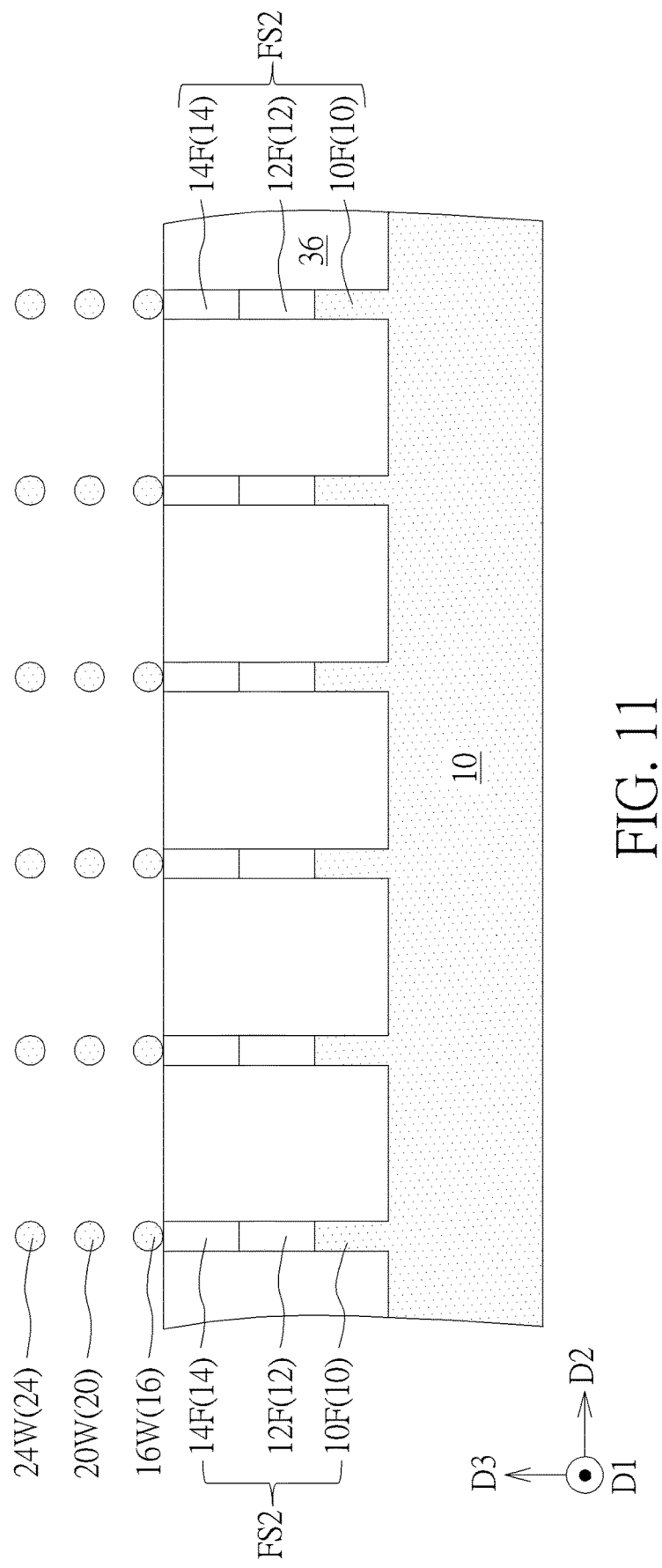
Figure 12:
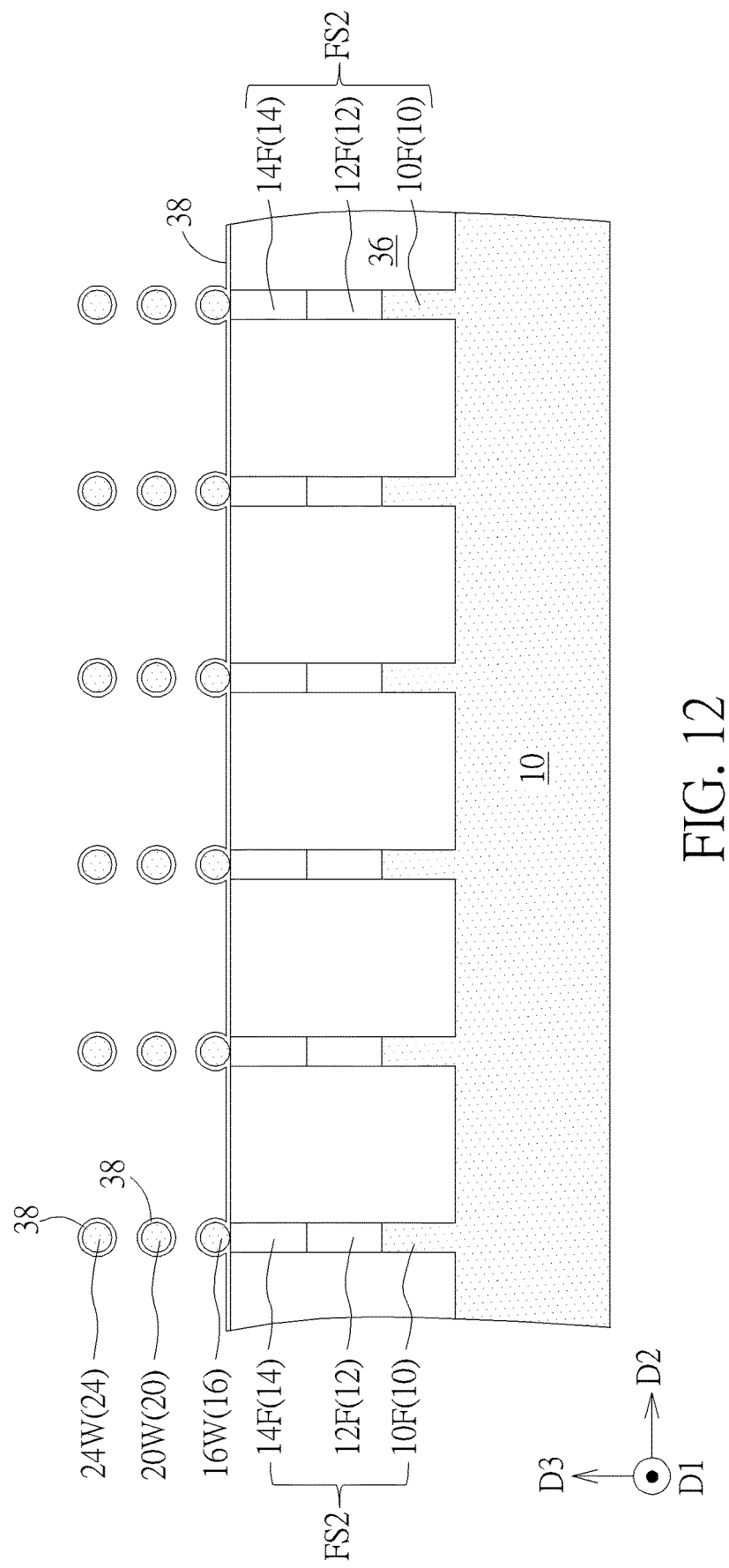
Figure 13:
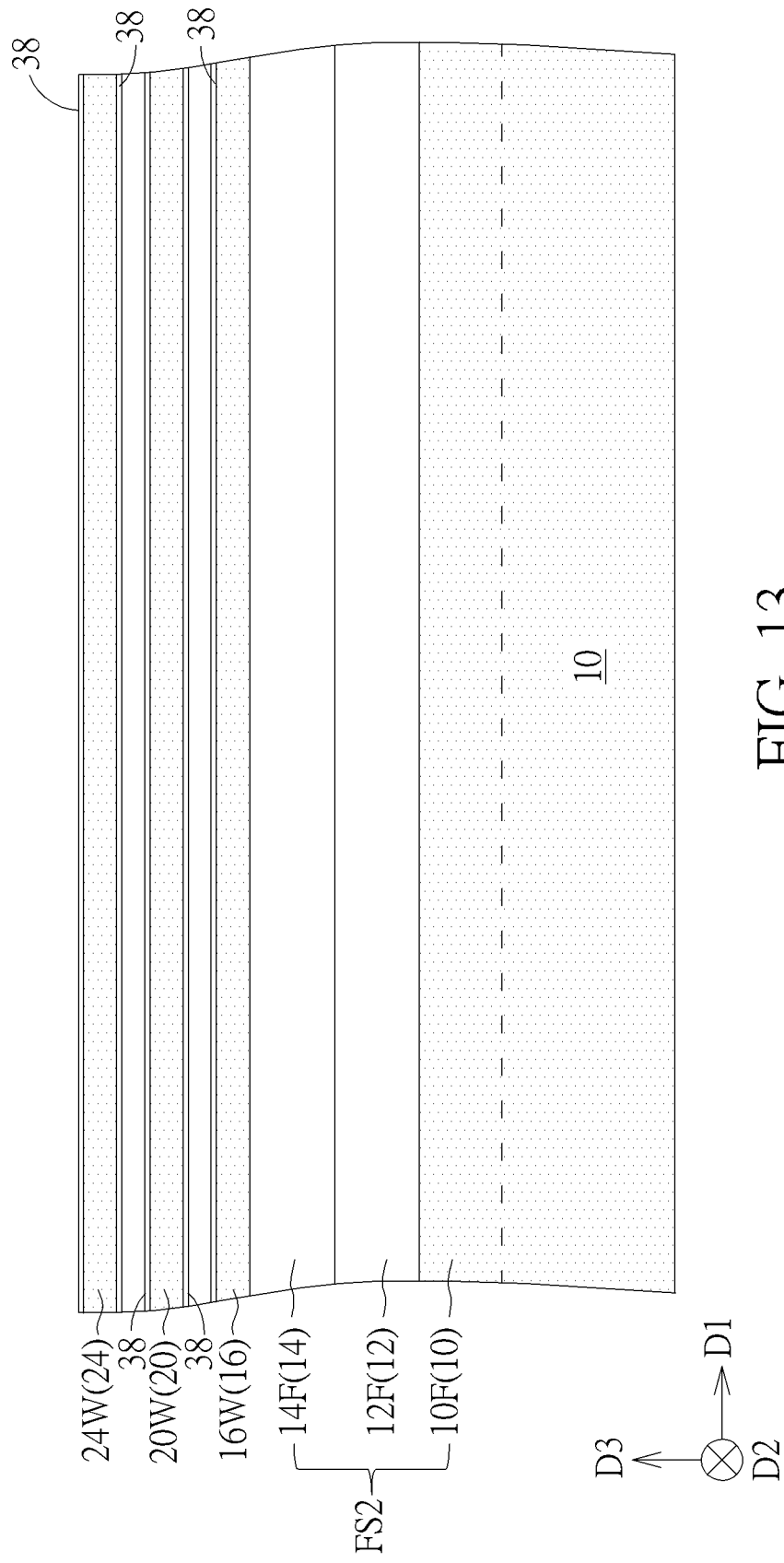

Please refer to FIGS. 2-13 and FIG. 1. FIGS. 2-13 are schematic drawings illustrating a manufacturing method of the semiconductor device 101 in this embodiment, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a cross-sectional diagram taken along another direction (such as along the first direction D1) in FIG. 12, and FIG. 1 may be regarded as a schematic drawing in a step subsequent to FIG. 12. The manufacturing method of the semiconductor device 101 in this embodiment may include but is not limited to the following steps. Firstly, as shown in FIG. 2, the semiconductor substrate 10 is provided, and the dielectric layer 14 is formed on the semiconductor substrate 10. In some embodiments, the barrier layer 12 may be formed on the semiconductor substrate 10 before the step of forming the dielectric layer 14. In other words, the dielectric layer 14 may be formed on the barrier layer 12, and the barrier layer 12 may be located between the dielectric layer and the semiconductor substrate 10. Subsequently, as shown in FIG. 2 and FIG. 3, a plurality of openings OP may be formed, and each of the openings OP may penetrate the dielectric layer 14 and exposes a part of the semiconductor substrate 10. When the barrier layer 12 is formed and located between the dielectric layer 12 and the semiconductor substrate 10, each of the openings OP may further penetrate the barrier layer 12 for exposing a part of the semiconductor substrate 10, but not limited thereto. In some embodiments, the openings OP may be formed by a patterning process, such as a photolithographic process, and one or more etching steps may be used to etch the dielectric layer 14 and the barrier layer 12 respectively in the patterning process. The dielectric layer 14 and the barrier layer 12 may be etched to be a plurality of patterned dielectric layers 14A and a plurality of patterned barrier layers 12A, and the patterned dielectric layers 14A and the patterned barrier layers 12A may substantially overlap with one another in the third direction D3, but not limited thereto.

As shown in FIG. 4 and FIG. 5, a stacked structure MS is formed on the dielectric layer 14, and the stacked structure MS includes a first semiconductor layer 16, a sacrificial layer (such as a first sacrificial layer 18 shown in FIG. 5), and a second semiconductor layer 20. The first semiconductor layer 16 may be partly formed in the openings OP and partly formed on the dielectric layer 14. The first sacrificial layer 18 may be formed on the first semiconductor layer 16. The second semiconductor layer 20 may be formed on the first sacrificial layer 18. In some embodiments, the first semiconductor layer 16 may be formed by an epitaxial growth process performed to the part of the semiconductor substrate 10 exposed by the openings OP, and each of the openings OP may be fully filled with the first semiconductor layer 16 accordingly, but not limited thereto. Additionally, in some embodiments, the material composition of the first semiconductor layer 16 may be identical to the material composition of the semiconductor substrate 10, but not limited thereto. In some embodiments, other material and/or other manufacturing process may be used to form the first semiconductor layer 16 according to some considerations. As shown in FIG. 4, when the first semiconductor layer 16 is formed by an epitaxial growth process, the first semiconductor layer 16 may be formed to be relatively thicker generally for ensuring that the first semiconductor layer 16 formed on the dielectric layer 16 is thick enough. However, the surface flatness of the first semiconductor layer 16 may be relatively worse under this situation, and a planarization process 91, such as a chemical mechanical polishing (CMP) process or other suitable planarization approaches, may be performed to the first semiconductor layer 16 before the step of forming the first sacrificial layer 18 for planarizing the top surface of the first semiconductor layer 16 and controlling the thickness of the first semiconductor layer 16 above the dielectric layer 14. In other words, a part of the first semiconductor layer 16 may remain on the dielectric layer 14 after the planarization process 91.

In some embodiments, the stacked structure MS may include a plurality of semiconductor layer/sacrificial layer pairs stacked in the third direction D3, and the amount of the semiconductor layer/sacrificial layer pairs may be modified according to the amount of the semiconductor wires required to be formed. For instance, the stacked structure MS may further include a second sacrificial layer 22, a third semiconductor layer 24, and a third sacrificial layer 26. The second sacrificial layer 22 may be formed on the second semiconductor layer 20, the third semiconductor layer 24 may be formed on the second sacrificial layer 22, and the third sacrificial layer 26 may be formed on the third semiconductor layer 24. In some embodiments, the first sacrificial layer 18, the second semiconductor layer 20, the second sacrificial layer 22, the third semiconductor layer 24, and the third sacrificial layer 26 may be formed by epitaxial growth processes or other suitable film-forming processes. Therefore, the first semiconductor layer 16, the second semiconductor layer 20, and the third semiconductor layer 24 may include III-V compound semiconductor materials, such as gallium nitride, gallium arsenide, indium phosphide, or other suitable III-V compound semiconductor materials, and the first sacrificial layer 18, the second sacrificial layer 22, and the third sacrificial layer 26 may include aluminum gallium nitride, aluminum gallium arsenide, indium gallium arsenide, or other suitable III-V compound materials, but not limited thereto. In some embodiments, the semiconductor layers and the sacrificial layers in the stacked structure MS may also be formed of other suitable materials and/or formed by other suitable manufacturing approaches according to some considerations. It is worth noting that, for successfully performing an etching process configured to remove each sacrificial layer, the first semiconductor layer 16, the second semiconductor layer 20, and the third semiconductor layer 24 may be made of the same semiconductor material preferably; the first sacrificial layer 18, the second sacrificial layer 22, and the third sacrificial layer 26 may be made of the same material preferably; and the etching selectivity between the material of each semiconductor layer in the stacked structure MS and the material of each sacrificial layer in the stacked structure MS should be high enough in the etching process configured to remove the sacrificial layers, but not limited thereto. In other words, there may be suitable matching combinations of the material of each semiconductor layer in the stacked structure MS and the material of each sacrificial layer in the stacked structure MS for ensuring the condition of the processes subsequently performed. For example, when the first semiconductor layer 16, the second semiconductor layer 20, and the third semiconductor layer 24 are made of gallium nitride, the first sacrificial layer 18, the second sacrificial layer 22, and the third sacrificial layer 26 may be made of aluminum gallium nitride preferably; when the first semiconductor layer 16, the second semiconductor layer 20, and the third semiconductor layer 24 are made of gallium arsenide, the first sacrificial layer 18, the second sacrificial layer 22, and the third sacrificial layer 26 may be made of aluminum gallium arsenide preferably; and when the first semiconductor layer 16, the second semiconductor layer 20, and the third semiconductor layer 24 are made of indium phosphide, the first sacrificial layer 18, the second sacrificial layer 22, and the third sacrificial layer 26 may be made of indium gallium arsenide preferably, but not limited thereto.

Subsequently, as shown in FIGS. 6-8, a patterning process 92 is performed for forming a plurality of fin-shaped structures (such as first fin-shaped structures FS1 shown in FIG. 8) on the semiconductor substrate 10. In some embodiments, a multiple patterning process, such as a self-aligned double patterning (SADP) process may be used to form the first fin-shaped structures FS1, but not limited thereto. For example, a hard mask HM may be formed on the stacked structure MS, and a plurality of mandrels 32 may be formed on the hard mask HM. Sidewall spacers 34 may be formed on sidewalls of the mandrels 32. The mandrels 32 may be removed after the step of forming the sidewall spacers 34, and the patterning process 92 may be performed using the sidewall spacers 34. In some embodiments, the pattern of the sidewall spacers 34 may be transfer to the hard mask HM, and the stacked structure MS, the pattered dielectric layers 14A, the patterned barrier layers 12A, and the semiconductor substrate 10 may be etched by using the HM as an etching mask for forming the first fin-shaped structures FS1. However, the manufacturing method of the first fin-shaped structures FS1 in this embodiment is not limited to the approach described above, and the first fin-shaped structures FS1 may also be formed by other suitable patterning approaches according to some considerations. It is worth noting that, when the patterning process 92 is performed using the sidewall spacers 34, the positions of the mandrels 32 and the dimension of each mandrel 32 have to be controlled for ensuring that the sidewall spacers 34 formed on the sidewalls of the mandrels 32 do not overlap the first semiconductor layer 16 located in the openings OP in the third direction D3. In other words, each of the mandrels 32 may be only located on the area outside the openings OP in the third direction D3, and a projection area of each of the mandrels 32 in the third direction D3 may be smaller than a projection area of each of the patterned dielectric layer 14A in the third direction D3. Additionally, in some embodiments, the material of the mandrels 32 may include a dielectric material, such as an organic dielectric layer (ODL), or other suitable materials, and the hard mask HM may include a single layer or multiple layers of mask materials. For instance, the hard mask HM may include a first hard mask layer 28 and the second hard mask layer 30 stacked with each other, and the first hard mask layer 28 and the second hard mask layer 30 may be made of different conductive materials and/or insulation materials, such as silicon oxide, silicon nitride, silicon oxynitride, amorphous silicon, or polysilicon, but not limited thereto. Additionally, the sidewall spacer 34 may include silicon oxide or other suitable materials having higher etching selectivity with the mandrels 32 and the hard mask HM.

In some embodiments, the patterning process 92 may include one or more anisotropic etching steps configured to etch each layer in the stacked structure MS, the patterned dielectric layers 14A, the patterned barrier layers 12A, and the semiconductor substrate 10, but not limited thereto. Therefore, the stacked structure MS, the patterned dielectric layers 14A, the patterned barrier layers 12A, and the semiconductor substrate 10 may be patterned by the patterning process 92 to be the first fin-shaped structures FS1, and the first semiconductor layer 16 in the openings OP may be removed completely by the patterning process 92. Each of the first fin-shaped structures FS1 may include a part of the second hard mask layer 30, a part of the first hard mask layer 28, a part of the third sacrificial layer 26, a part of the third semiconductor layer 24, a part of the second sacrificial layer 22, a part of the second semiconductor layer 20, a part of the first sacrificial layer 18, a part of the first semiconductor layer 16, a part of the dielectric layer 14, a part of the barrier layer 12, and a part of the semiconductor substrate 10. In other words, the second hard mask layer 30, the first hard mask layer 28, the third sacrificial layer 26, the third semiconductor layer 24, the second sacrificial layer 22, the second semiconductor layer 20, the first sacrificial layer 18, the first semiconductor layer 16, the dielectric layer 14, the barrier layer 12, and a portion of the semiconductor substrate 10 may be patterned by the patterning process 92 to become a plurality of second fin-shaped hard mask layers 30F, a plurality of first fin-shaped hard mask layers 28F, a plurality of third fin-shaped sacrificial layers 26F, a plurality of third fin-shaped semiconductor layers 24F, a plurality of second fin-shaped sacrificial layers 22F, a plurality of second fin-shaped semiconductor layers 20F, a plurality of first fin-shaped sacrificial layers 18F, a plurality of first fin-shaped semiconductor layers 16F, a plurality of fin-shaped dielectric layer 14F, a plurality of fin-shaped barrier layers 12F, and a plurality of semiconductor fins 10F respectively. Each of the second fin-shaped hard mask layers 30F, each of the first fin-shaped hard mask layers 28F, each of the third fin-shaped sacrificial layers 26F, each of the third fin-shaped semiconductor layers 24F, each of the second fin-shaped sacrificial layers 22F, each of the second fin-shaped semiconductor layers 20F, each of the first fin-shaped sacrificial layers 18F, each of the first fin-shaped semiconductor layers 16F, each of the fin-shaped dielectric layer 14F, each of the fin-shaped barrier layers 12F, and each of the semiconductor fins 10F may be stacked and overlap with one another in the third direction D3 for forming the first fin-shaped structure FS1.

As shown in FIG. 8 and FIG. 9, in some embodiments, the isolation structure 36 may be formed between the first fin-shaped structures FS1 after the step of forming the first fin-shaped structures FS1. In some embodiments, the isolation structure 36 may be formed by filling the space between the first fin-shaped structures FS1 with an isolation material and performing a chemical mechanical polishing process for removing the surplus isolation material and exposing the second mask layer 30, but not limited thereto. In some embodiments, some of the first fin-shaped structures FS1 which are required may be removed and a portion of a specific first fin-shaped structure FS1 may be removed before the step of forming the isolation structure 36, but not limited thereto. Subsequently, an etching back process may be performed to remove the second fin-shaped hard mask layer 30F and the first fin-shaped hard mask layer 28F in each of the first fin-shaped structures FS1 and expose the third fin-shaped sacrificial layers 26F. In some embodiments, the isolation structure 36 may be partially removed by the etching back process described above, but not limited thereto. Additionally, a doping process 93 may be performed according to some considerations after the step of removing the second fin-shaped hard mask layers 30F and the first fin-shaped hard mask layers 28F, and the doping process 93 may include one or more doping steps for doping the first fin-shape structures FS1 and/or the semiconductor substrate 10 with required dopants by implantation, but not limited thereto.

As shown in FIG. 9 and FIG. 10, an etching back process may be performed to the isolation structure 36 subsequently for removing a portion of a relatively upper part in the isolation structure 36 and exposing the third fin-shaped sacrificial layer 26F, the third fin-shaped semiconductor layer 24F, the second fin-shaped sacrificial layer 22F, the second fin-shaped semiconductor layer 20F, the first fin-shaped sacrificial layer 18F, and the first fin-shaped semiconductor layer 16F in each of the first fin-shaped structures FS1. Subsequently, an etching process 94 may be performed to remove the sacrificial layers (such as the first sacrificial layer 18, the second sacrificial layer 22, and the third sacrificial layer 26) in each of the first fin-shaped structures FS1. The isolation structure 36 may cover the sidewall of the dielectric layer 14 in each of the first fin-shaped structures FS1, the sidewall of the barrier layer 12 in each of the first fin-shaped structures FS1, and the sidewall of the semiconductor fin 10F in each of the first fin-shaped structures FS1 during the etching process 94, but not limited thereto. After the etching process 94, the remaining fin-shaped dielectric layers 14F, the remaining fin-shaped barrier layer 12F, and the remaining semiconductor fins 10F may be regarded as the second fin-shaped structures FS2, but not limited thereto. By the matching combination of the materials of the sacrificial layers and the semiconductor layers and/or modifying the process parameters of the etching process 94 (such as the process time or the etching rate), the first sacrificial layer 18, the second sacrificial layer 22, and the third sacrificial layer 26 may be completely removed by the etching process 94 without etching the semiconductor layers in the first fin-shaped structures FS1 or with just slightly etching effect to the semiconductor layers in the first fin-shaped structures FS1. Therefore, the first semiconductor layer 16 in the first fin-shaped structure FS1 may be etched to become the first semiconductor wire 16W by the etching process 94, the second semiconductor layer 20 in the first fin-shaped structure FS1 may be etched to become the second semiconductor wire 20W by the etching process 94, and the third semiconductor layer 24 in the first fin-shaped structure FS1 may be etched to become the third semiconductor wire 24W by the etching process 94. In some embodiments, the first semiconductor layer 16, the second semiconductor layer 20, and the third semiconductor layer 24 may not be etched by the etching process 94, and the etching process 94 may be used to remove the first sacrificial layer 18, the second sacrificial layer 22, and the third sacrificial layer 26 only. The first fin-shaped semiconductor layer 16F remaining after the etching process 94 is regarded as the first semiconductor wire 16W, the second fin-shaped semiconductor layer 20F remaining after the etching process 94 is regarded as the second semiconductor wire 20W, and the third fin-shaped semiconductor layer 24F remaining after the etching process 94 is regarded as the third semiconductor wire 24W.

In some embodiments, the etching process 94 may include an isotropic etching process (such as a wet etching process) for providing higher etching selectivity, but not limited thereto. For instance, the etching process 94 may be a wet etching process using sodium hydroxide, potassium hydroxide, and/or other suitable etchants when the material of the first semiconductor layer 16, the second semiconductor layer 20, and the third semiconductor layer 24 is gallium nitride and the material of the first sacrificial layer 18, the second sacrificial layer 22, and the third sacrificial layer 26 is aluminum gallium nitride. The etching process 94 may be a wet etching process using hydrochloric acid (HCl) and/or other suitable etchants when the material of the first semiconductor layer 16, the second semiconductor layer 20, and the third semiconductor layer 24 is indium phosphide and the material of the first sacrificial layer 18, the second sacrificial layer 22, and the third sacrificial layer 26 is indium gallium arsenide. The etching process 94 may be a wet etching process using hydrofluoric acid (HF) and/or other suitable etchants when the material of the first semiconductor layer 16, the second semiconductor layer 20, and the third semiconductor layer 24 is gallium arsenide and the material of the first sacrificial layer 18, the second sacrificial layer 22, and the third sacrificial layer 26 is aluminum gallium arsenide.

It is worth noting that, in some embodiments, the first semiconductor wire 16W, the second semiconductor wire 20W, and the third semiconductor wire 24W stacked in the third direction D3 may be separated from one another, and the first semiconductor wire 16W may directly contact the dielectric layer 14 in the corresponding second fin-shaped structure FS2 still because the etching effect of the etching process 94 on the semiconductor layers is reduced, but not limited thereto. Subsequently, as shown in FIG. 12 and FIG. 13, the gate dielectric layer 38 may be formed on the first semiconductor wires 16W, the second semiconductor wires 20W, and the third semiconductor wires 24W. In some embodiments, the gate dielectric layer 38 may be formed by an atomic layer deposition (ALD) process or other suitable film-forming processes. The gate dielectric layer 38 may surround each of the first semiconductor wires 16W, each of the second semiconductor wires 20W, and each of the third semiconductor wires 24W, and a lower portion of each of the first semiconductor wires 16 may be directly connected with the dielectric layer 14 still. Subsequently, as shown in FIG. 1, the gate structure GS is formed covering the gate dielectric layer 38, the first semiconductor wires 16W, the second semiconductor wires 20W, the third semiconductor wires 24W, and the isolation structure 36. In some embodiments, the gate structure GS may encompass a portion of each of the first semiconductor wires 16W, a portion of each of the second semiconductor wires 20W, and a portion of each of the third semiconductor wires 24W. A part of each of the first semiconductor wires 16W without being encompassed by the gate dielectric layer 38 and the gate structure GS, a part of each of the second semiconductor wires 20W without being encompassed by the gate dielectric layer 38 and the gate structure GS, and a part of each of the third semiconductor wires 24W without being encompassed by the gate dielectric layer 38 and the gate structure GS may become source regions and drain regions (not shown) by a doping process or other suitable treatments for forming a transistor structure, such as being regarded as a GAA transistor structure, but not limited thereto. By the manufacturing method of this embodiment, the first semiconductor layer 16 may be formed by epitaxial growth starting from the semiconductor substrate 10 exposed by the openings and be further formed on the dielectric layer 14. The first semiconductor layer 16 with better quality may be formed on the dielectric layer 14, and the purpose of improving the manufacturing yield of the semiconductor device 101 and/or the purpose of enhancing the electrical performance of the semiconductor device 101 may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 14:
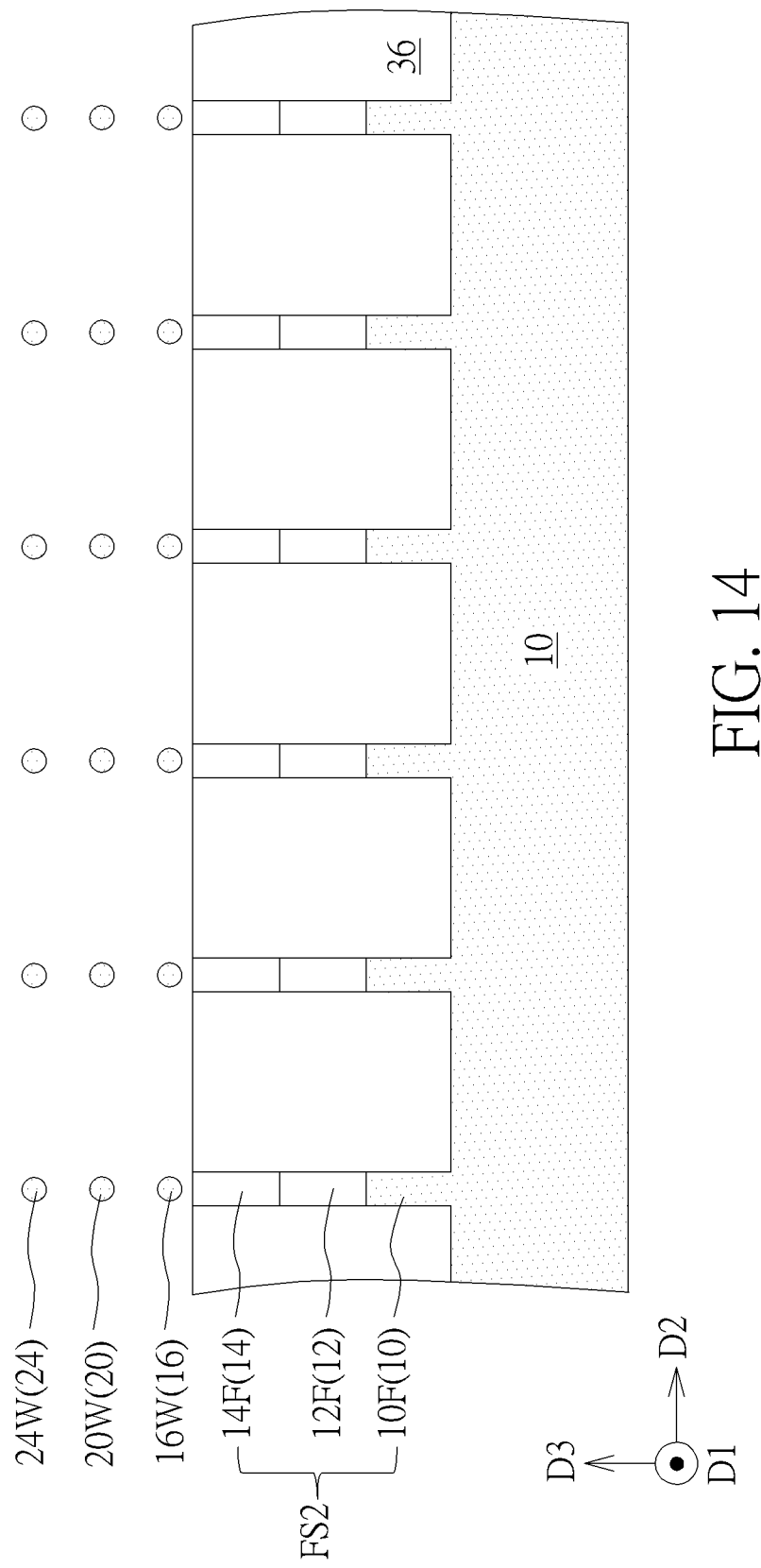
Figure 15:
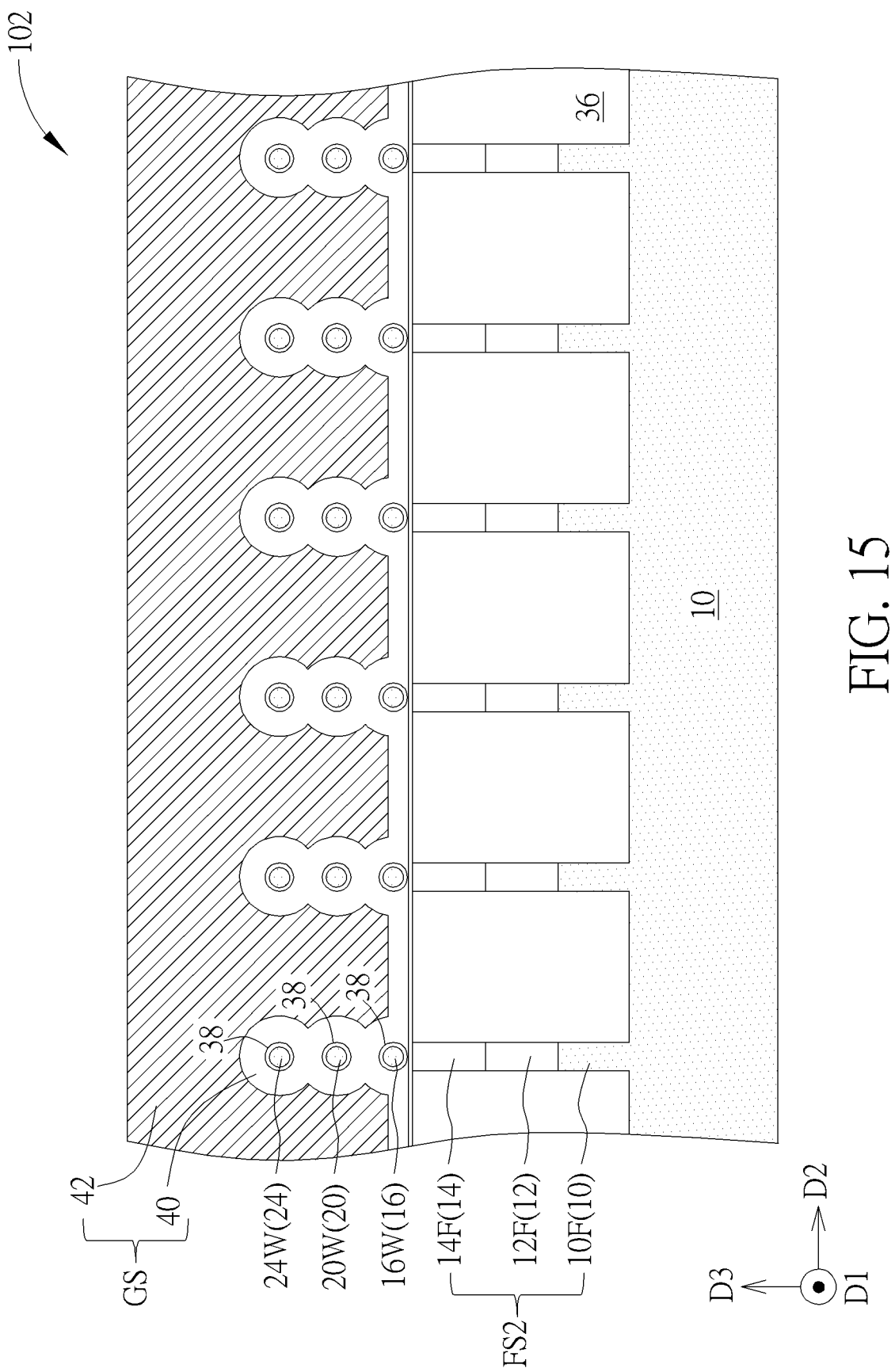

Please refer to FIG. 14, FIG. 15, and FIG. 10. FIG. 14 and FIG. 15 are schematic drawings illustrating a manufacturing method of a semiconductor device 102 according to a second embodiment of the present invention, wherein FIG. 15 is a schematic drawing in a step subsequent to FIG. 14, and FIG. 14 may be regarded as a schematic drawing in a step subsequent to FIG. 10. The difference between the manufacturing method in this embodiment and the manufacturing method in the first embodiment described above is that, as shown in FIG. 10 and FIG. 14, each of the first semiconductor wires 16W may be separated from the dielectric layer 14 in this embodiment by modifying the etching condition of the etching process 94, controlling the thicknesses of the first semiconductor layer 16, the second semiconductor layer 20, and the third semiconductor layer 24, and/or controlling the width of each of the first fin-shaped structure (such as controlling the width of each first fin-shaped structure FS1 when forming the first fin-shaped structure FS1 shown in FIG. 8). Therefore, as shown in FIG. 14 and FIG. 15, after the steps of forming the gate dielectric layer 38 and the gate structure GS, the gate dielectric layer 38 may be located between the first semiconductor wire 16W and the dielectric layer 14 in the third direction D3. The surface area of the first semiconductor wires covered by the gate structure GS may be increased by this approach, and the electrical performance of the semiconductor device 102 may be enhanced accordingly.

To summarize the above descriptions, according to the semiconductor device and the manufacturing method thereof in the present invention, the openings are formed in the dielectric layer covering the semiconductor substrate for partially exposing the semiconductor substrate, and the first semiconductor layer may be formed on the dielectric layer by growing from the semiconductor substrate exposed by the openings. The semiconductor layer with higher quality may be formed on the dielectric layer by this approach, and the manufacturing yield and/or the electrical performance of the semiconductor device may be improved accordingly. Additionally, the barrier layer may be disposed for keeping the semiconductor substrate from being influenced by the process of forming the dielectric layer and avoiding the indirect influence on the quality of the first semiconductor layer subsequently formed on the semiconductor substrate. The electrical performance of the semiconductor device may be further improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a fin-shaped structure disposed on the semiconductor substrate, wherein the fin-shaped structure comprises:
   a semiconductor fin;
   a dielectric layer disposed on the semiconductor fin; and a barrier layer disposed between the dielectric layer and the semiconductor fin in a thickness direction of the semiconductor substrate;
a first semiconductor wire disposed above the fin-shaped structure; and
a second semiconductor wire disposed above the first semiconductor wire, wherein the first semiconductor wire is disposed between the second semiconductor wire and the fin-shaped structure in the thickness direction of the semiconductor substrate, wherein the first semiconductor wire is separated from the second semiconductor wire, the first semiconductor wire is separated from the dielectric layer, and an elongation direction of the first semiconductor wire, an elongation direction of the second semiconductor wire, and a elongation direction of the dielectric layer are parallel to one another and orthogonal to the thickness direction of the semiconductor substrate; and
an isolation structure disposed on a sidewall of the fin-shaped structure, wherein a top surface of the isolation structure and a top surface of the dielectric layer are coplanar.

2. The semiconductor device according to claim 1, wherein a material composition of the barrier layer is different from a material composition of the dielectric layer and a material composition of the semiconductor fin.

3. The semiconductor device according to claim 1, wherein the barrier layer comprises a III-V compound semiconductor layer.

4. The semiconductor device according to claim 1, wherein the semiconductor fin is directly connected with the semiconductor substrate, and a material composition of the first semiconductor wire is identical to a material composition of the semiconductor fin and a material composition of the semiconductor substrate.

5. The semiconductor device according to claim 1, further comprising:
a gate dielectric layer disposed on the first semiconductor wire and the second semiconductor wire; and
a gate structure disposed on the gate dielectric layer.

6. A semiconductor device, comprising:
a semiconductor substrate;
a fin-shaped structure disposed on the semiconductor substrate, wherein the fin-shaped structure comprises:
a semiconductor fin;
a dielectric layer disposed on the semiconductor fin; and
a barrier layer disposed between the dielectric layer and the semiconductor fin in a thickness direction of the semiconductor substrate;
a first semiconductor wire disposed above the fin-shaped structure;
a second semiconductor wire disposed above the first semiconductor wire, wherein the first semiconductor wire is disposed between the second semiconductor wire and the fin-shaped structure in the thickness direction of the semiconductor substrate, the first semiconductor wire is separated from the second semiconductor wire, and the first semiconductor wire directly contacts the dielectric layer;
a gate dielectric layer disposed on the first semiconductor wire and the second semiconductor wire;
a gate structure disposed on the gate dielectric layer, wherein a part of the gate dielectric layer disposed on the first semiconductor wire is located between the first semiconductor wire and the dielectric layer in the thickness direction of the semiconductor substrate; and
an isolation structure disposed on a sidewall of the fin-shaped structure, wherein a top surface of the isolation structure and a top surface of the dielectric layer are coplanar.

7. The semiconductor device according to claim 6, wherein a material composition of the barrier layer is different from a material composition of the dielectric layer and a material composition of the semiconductor fin.

8. The semiconductor device according to claim 6, wherein the barrier layer comprises a III-V compound semiconductor layer.

9. The semiconductor device according to claim 6, wherein the semiconductor fin is directly connected with the semiconductor substrate, and a material composition of the first semiconductor wire is identical to a material composition of the semiconductor fin and a material composition of the semiconductor substrate.

* * * * *